US007381655B2

(12) United States Patent
Furukawa et al.

(10) Patent No.: US 7,381,655 B2
(45) Date of Patent: Jun. 3, 2008

(54) MANDREL/TRIM ALIGNMENT IN SIT PROCESSING

(75) Inventors: Toshiharu Furukawa, Essex Junction, VT (US); David V. Horak, Essex Junction, VT (US); Charles W. Koburger, III, Delmar, NY (US); Qiqing C. Ouyang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 11/226,726

(22) Filed: Sep. 14, 2005

(65) Prior Publication Data

US 2007/0059891 A1 Mar. 15, 2007

(51) Int. Cl.
*H01L 21/302* (2006.01)
*H01L 21/461* (2006.01)

(52) U.S. Cl. ............... 438/736; 438/737; 257/E21.023; 257/E21.209

(58) Field of Classification Search ................ 438/736, 438/737
See application file for complete search history.

(56) References Cited

U.S. PATENT DOCUMENTS 6,368,982 B1 * 4/2002 Yu ............................. 438/753
6,706,613 B2 * 3/2004 You et al. .................. 438/424
6,875,703 B1 4/2005 Furukawa et al.
7,279,375 B2 * 10/2007 Radosavljevic et al. ... 438/197
2003/0115750 A1 6/2003 Conrad et al.
2003/0193058 A1 * 10/2003 Fried et al. ................ 257/200
2004/0132236 A1 * 7/2004 Doris et al. ................ 438/182

OTHER PUBLICATIONS

U.S. Appl. No. 10/711,458, Furukawa, et al.

* cited by examiner

*Primary Examiner*—Carl Whitehead, Jr.
*Assistant Examiner*—Daniel Luke
(74) *Attorney, Agent, or Firm*—Gibb & Rahman, LLC

(57) ABSTRACT

Disclosed herein is an imaging method for patterning component shapes (e.g., fins, gate electrodes, etc.) into a substrate. By conducting a trim step prior to performing either an additive or subtractive sidewall image transfer process, the method avoids the formation of a loop pattern in a hard mask and, thus, avoids a post-SIT process trim step requiring alignment of a trim mask to sub-lithographic features to form a hard mask pattern with the discrete segments. In one embodiment a hard mask is trimmed prior to conducting an additive SIT process so that a loop pattern is not formed. In another embodiment an oxide layer and memory layer that are used to form a mandrel are trimmed prior to the conducting a subtractive SIT process. A mask is then used to protect portions of the mandrel during etch back of the oxide layer so that a loop pattern is not formed.

6 Claims, 13 Drawing Sheets

MANDREL/TRIM ALIGNMENT IN SIT PROCESSING

BACKGROUND OF THE INVENTION

1. Field of the Invention

The invention generally relates to sidewall image transfer processing, and, more particularly, the invention relates to improved mandrel/trim alignment in sidewall image transfer processing.

2. Description of the Related Art

Device parameters of fin-type field effect transistors (FinFETs) are extremely sensitive to semiconductor fin thickness. In order to realize the full potential of a FinFET, the silicon fin must be very thin, e.g., on the same order of thickness as that of a fully-depleted silicon-on-insulator (SOI). Similarly, line width control problems during gate electrode definition for small devices can lead to performance degradation, power consumption control issues and yield loss. Previously, lithographic techniques have been used to form device components (e.g., semiconductor fins for FinFETs, gate electrodes, etc.) in a substrate. For example, using photolithography a feature can be printed directly into a photo-resist layer and the image can be transferred into an underlying film. However, current state-of-the-art lithographic technology can not adequately and efficiently satisfy the ever-increasing demand for smaller devices and device components. Thus, the requirement for very thin, replicable, device components has re-awakened interest in sidewall image transfer (SIT) to form such components in a substrate.

SUMMARY OF THE INVENTION

In view of the foregoing, embodiments of the invention disclosed herein provide a patterning method for forming one or more discrete components in a substrate. For example, the embodiments of the method can be used to form narrow silicon fins for a fin-type field effect transistor (finFET) or narrow gate electrodes to contact a dielectric layer (e.g., a gate dielectric layer) above an active silicon region (e.g., an active silicon region in a buried oxide substrate layer or an active silicon region isolated by shallow trench isolation (STI) structures). Embodiments of the method incorporate the use of sidewall image transfer (SIT) techniques, e.g., additive or subtractive SIT techniques, to create a pattern in a mask. The patterned mask is then used to transfer the image into the substrate (e.g., by using a directional etching process) to form the one or more components. However, by conducting a trim step prior to performing either the additive or subtractive SIT process, the method avoids the formation of a continuous loop pattern in the hard mask and, thus, avoids a post-SIT process trim step. Specifically, such a pre-SIT process trim step avoids having to align a trim mask to features having less than current state of the art minimum lithographic dimensions in order to remove portions of a continuous loop to form a pattern with one or more discrete segments. For example, the method may avoid a post-SIT process trim step to remove ends portions of either a rectangular or trapezoidal loop to form a pattern with two parallel or two angled segments, respectively.

More particularly, one embodiment of the patterning method incorporates the use of an additive SIT process and comprises forming a hard mask layer (i.e., a first mask layer) on a substrate and a trim mask layer (i.e., a second mask layer) on the hard mask layer. The composition of the substrate can vary depending upon the type of component or components being formed. The trim mask layer is patterned to expose at least one selected portion (e.g., end portions) of the hard mask layer. Patterning the trim mask layer may include aligning the pattern of the trim mask with features (e.g., active silicon regions) in the substrate. The hard mask layer is then trimmed to remove the selected portion(s). This trimming process thus exposes portion(s) of the substrate. More importantly, removing the selected portion(s) of the hard mask layer prevents a complete loop pattern from being formed as a result of the subsequent additive SIT process and, thus, ensures that a pattern with one or more discrete segments is created in the hard mask. Once the selected portion(s) of the hard mask layer are removed, the trim mask layer is removed.

After the trim mask layer is removed, the additive SIT process is performed. The additive SIT process comprises forming a structure with vertical walls, such as mandrel, on the hard mask and substrate. Specifically, the mandrel is formed such that it extends over the remaining hard mask layer and onto the exposed portions of the substrate. The mandrel is further formed such that at least one section of the hard mask layer is exposed adjacent to at least one of the vertical walls. The mandrel may be formed by depositing a mandrel layer and then depositing and patterning a mandrel mask layer (i.e., a third mask layer). Once the mandrel mask is patterned, the mandrel layer is etched selective to the hard mask and substrate. Various materials may be used to form the mandrel layer as long as the mandrel can be selectively removed from the hard mask layer and from the substrate. Spacer(s), having a predetermined thickness, are then formed above the exposed section(s) of the hard mask layer adjacent to the vertical wall. The predetermined thickness of the spacer(s) is equal to a desired width of the component(s) being formed (e.g., a desired width of a fin or a desired width of a conductor). After the spacer(s) are formed, the mandrel is removed. Once the mandrel is removed, the image of the spacer(s) is transferred into the hard mask layer to create the pattern with at least one discrete segment. Once the pattern is formed in the hard mask layer, the spacer(s) can be removed. The substrate is then etched to transfer the pattern of the hard mask layer into the substrate and, thereby, create the at least one discrete component.

Another embodiment of the patterning method incorporates the use of a subtractive SIT process and comprises forming a hard mask layer (i.e., a first mask layer) on a substrate, a memory layer on the hard mask layer, an oxide layer on the memory layer and a trim mask layer (i.e., a second mask layer) on the oxide layer. As with the previously described embodiment, the composition of the substrate can vary depending upon the type of component or components being formed. The trim mask layer is patterned and etched to expose at least one selected portion of the oxide layer above the memory layer. Patterning the trim mask layer may include aligning the pattern of the trim mask with features (e.g., active silicon regions) within the substrate. Then, the exposed selected portion(s) of the oxide layer and the memory layer below are trimmed. This trimming process exposes both portion(s) of the hard mask layer and selected side edge(s) of the memory and oxide layers. Once the selected portion(s) of the oxide and memory layers are removed, the trim mask layer is removed.

After the trim mask layer is removed, the subtractive SIT process is performed. Specifically, a mandrel mask layer (i.e., a third mask layer) is deposited on the top surface of the oxide layer and onto the exposed portion(s) of the hard mask so that the selected edge(s) of the memory layer and oxide layer are covered and protected. The mandrel mask layer is patterned to form a structure having vertical walls (e.g., a mandrel). The mandrel is etched to the hard mask layer such that the selected side edge(s) of the memory layer and oxide layer remain covered, such that additional portions of the hard mask are exposed and such that one or more unprotected side edges of the oxide layer are exposed at one or more of the vertical walls. The mandrel mask layer functions as a diffusion-block or chemical-block during subsequent processing steps and, specifically, should be formed of a material having a predetermined thickness and capable of withstanding a subsequent Chemical Oxide Removal (COR) process. Once the mandrel is formed, the COR process is performed to etch back the unprotected side edge(s) of the oxide layer at the vertical wall(s) beneath the mandrel mask layer thereby exposing outer margin(s) of the memory layer. During the COR process, the top surface and selected side edge(s) of the oxide layer are protected by the mandrel mask layer, thereby, preventing exposure of a complete loop pattern of the outer margins of the memory layer as the oxide layer is etched back. The unprotected side edge(s) of the oxide layer are etched backed a predetermined distance equal to a desired width of the component or components.

After the (COR) process, the mandrel mask layer is removed and the exposed outer margin(s) of the memory layer are protected. Specifically, a blanket planarization material (e.g., a polymer) is deposited over the exposed portions of the hard mask layer, over the exposed outer margin(s) of the memory layer and over the oxide layer. The planarization material is then etched or developed back to expose a top surface of the oxide layer. Once exposed, the oxide layer is removed as are the remaining unprotected memory layer below the oxide layer and the planarization material. The image of the outer margin(s) of the memory layer remaining on the hard mask layer is then transferred into the hard mask layer to create the pattern with one or more discrete segments. As with the previously described embodiment, once the pattern is formed in the hard mask layer, the substrate is etched to transfer the pattern of the hard mask layer into the substrate and, thereby, create the one or more discrete components in the substrate.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
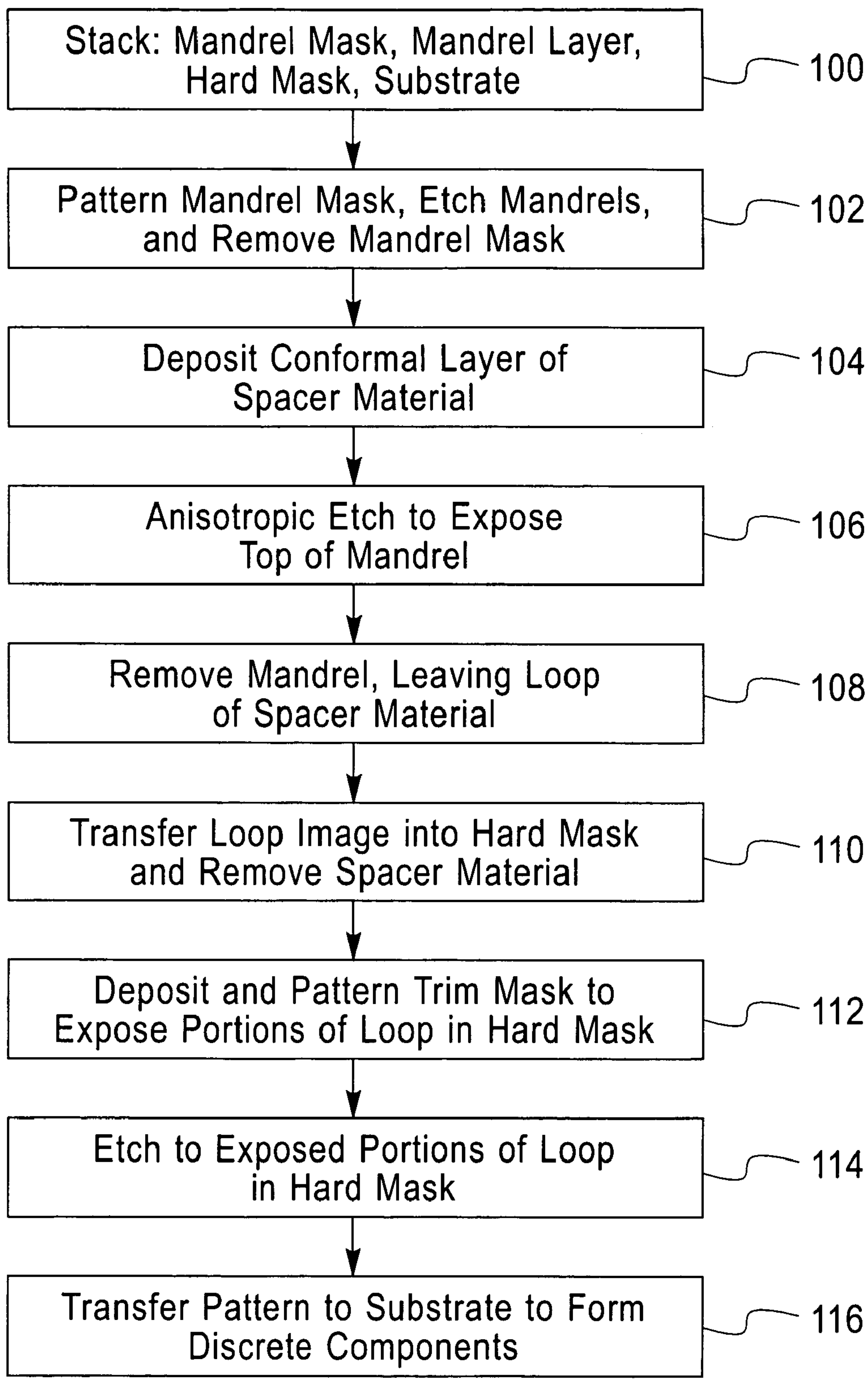
FIG. 1 is a schematic flow diagram illustrating a method of forming device components using an additive sidewall image transfer technique.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

Previously, sidewall image transfer (SIT) techniques were utilized to address field effect transistor (FET) channel length formation. SIT techniques have not generally been used in production because advances in lithography kept up with scaled device demands. However, recently lithographic advances have not kept up with device demands and, specifically, have not been able to provide enough line width control to meet necessary targets. For example, FinFET device parameters are extremely sensitive to the thickness of the silicon device fin. In order to realize the full potential of FinFETs, the silicon fins must be very thin, e.g., on the same order of thickness as the thickness of a fully-depleted SOI, which can not be achieved by current state of the art photolithographic techniques. Thus, this requirement for very thin very repeatable silicon fins has re-awakened interest in SIT because SIT methods of patterning device components (e.g., fins, gates, etc.) do not rely on photolithography to determine the smallest useable feature size (and tolerance).

Figure 2:
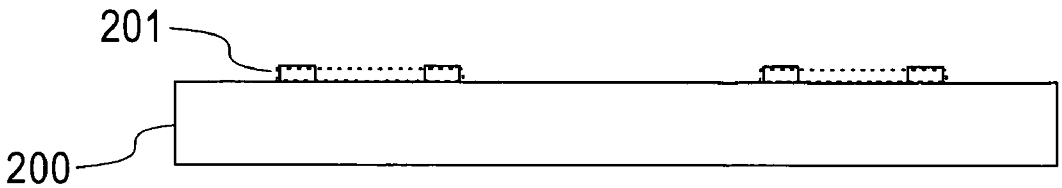
FIGS. 2-4 are schematic diagrams illustrating partially completed devices formed according to the methods of FIG. 1 or 5.
Figure 3:
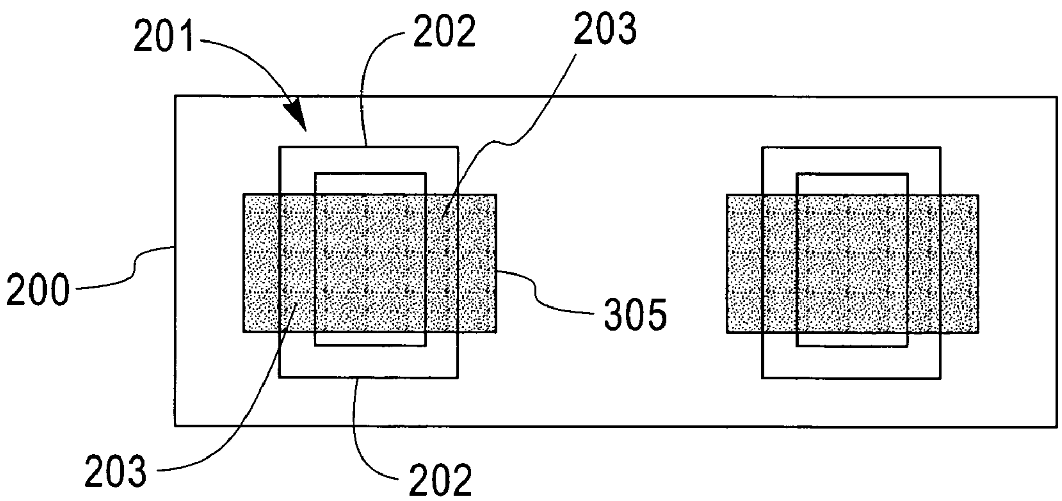
Figure 4:
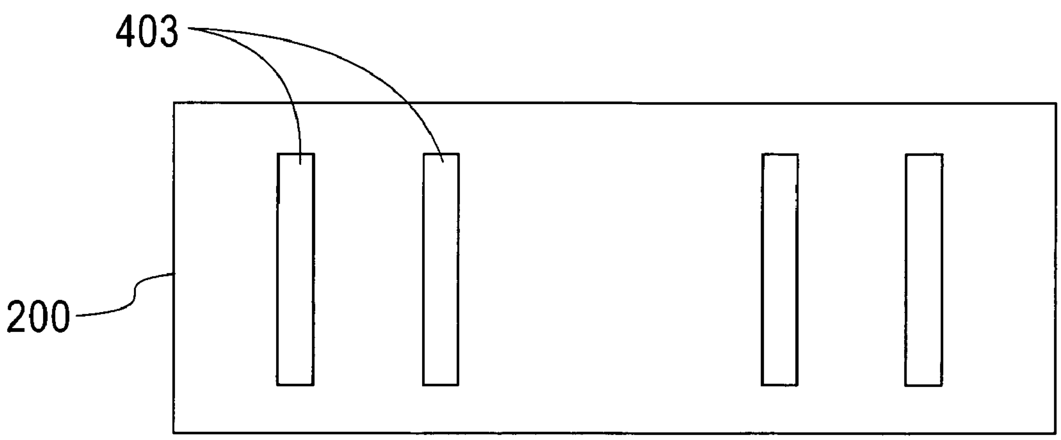

Referring to FIG. 1, an exemplary additive SIT comprises defining a mandrel (e.g., a narrow band) across a hard mask on a substrate. Specifically, a multi-layer stack comprising, for example, a substrate with underlying polysilicon for FET gate patterning, a thin dielectric (e.g., nitride) hard mask layer, a thick mandrel (e.g., a polysilicon) layer, and a mandrel mask layer, is patterned and etched using standard lithographic techniques to form the mandrel (100-102) with vertical walls above the hard mask layer. Then, spacers are formed on the hard mask adjacent to the walls of the mandrels (e.g., by depositing a thin conformal oxide or nitride layer and performing an anisotropic etch to remove the conformal oxide or nitride layer from the top of the mandrel layer and from horizontal surfaces) (104-106). The spacer thickness is chosen to be the same as that of the desired width of the final shape (with any etch film erosion factored in). Thus, spacers are formed on the vertical walls of a mandrel and these spacers determine the final pattern widths and tolerances of the components being formed in the substrate. This SIT process generates a continuous loop of spacer material around all of the walls of a mandrel rather than forming discrete segments (108). This loop pattern 201 image created from the walls of the mandrel is then transferred (e.g., by reactive ion etching RIE) into the hard mask on the substrate 200 (110, see FIGS. 2-3)). The hard mask is used to pattern the components (e.g., fins, gates, etc.) in the substrate. In order to form one or more discrete components in the substrate, as opposed to a continuous loop 201, an additional etching process must be conducted to remove one or more portions of the hard-mask loop 201 (112). For example, a trim mask 305 can be deposited and patterned to expose the end portions 202 of hard mask loop 201 and to protect the hard mask side portions 203. The exposed end portions 202 of the hard mask loop 201 are then removed (i.e., trimmed) to form a hard mask pattern with two discrete segments 403 on the substrate 200 (114, see FIG. 4). Lastly, the hard mask pattern is transferred into the substrate to form the discrete component(s) (e.g., fins, electrodes, etc.) (116).

Figure 5:
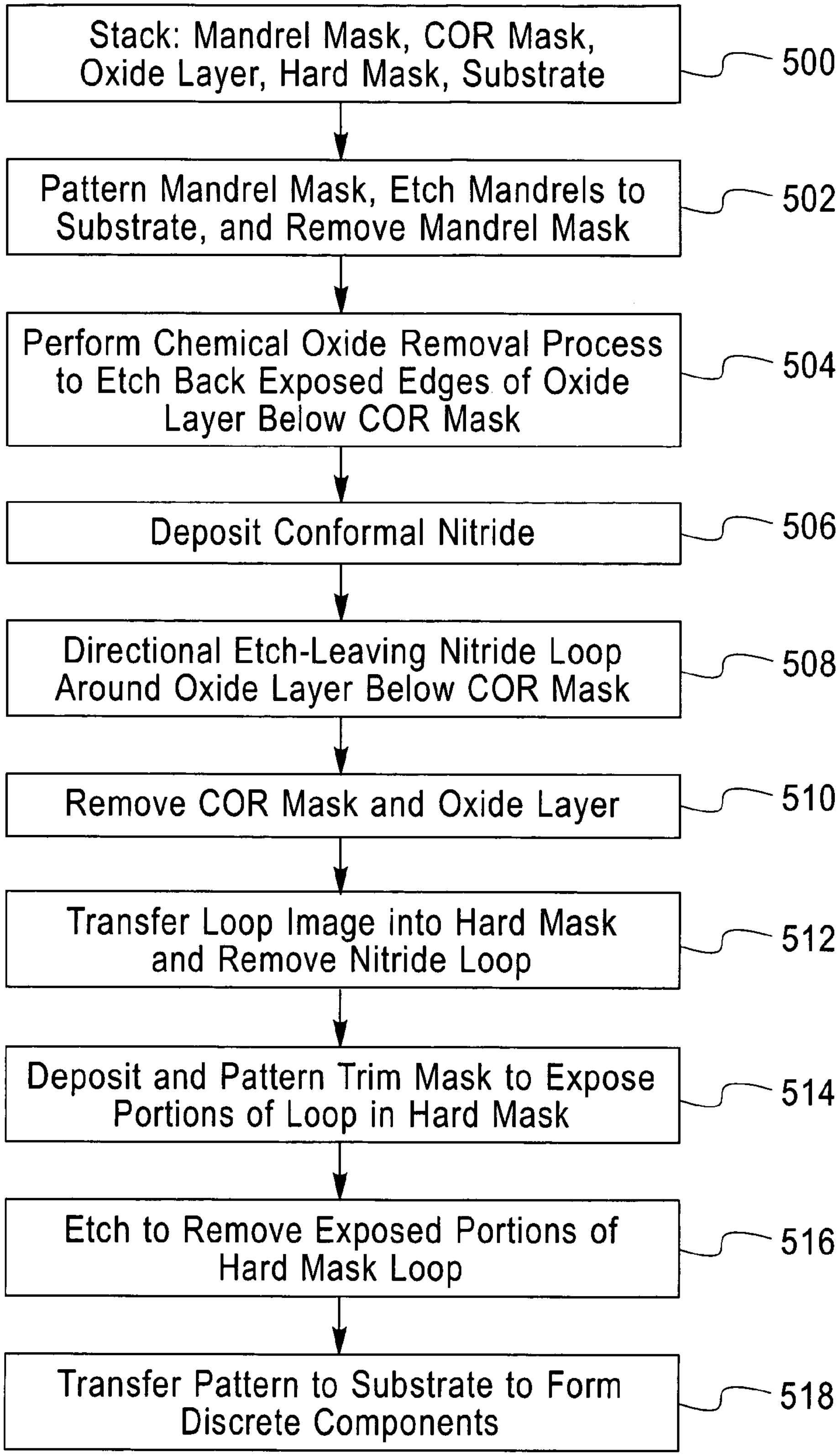
FIG. 5 is a schematic flow diagram illustrating a method of forming device components using a subtractive sidewall image transfer

Alternatively, referring to FIG. 5, subtractive SIT processing (e.g., as disclosed in U.S. patent application Ser. No. 10/711,458, filed on Sep. 20, 2004, incorporated herein by reference) can be used to form components (e.g., fins, gates, etc.) in a substrate. An exemplary subtractive SIT process begins with a multi-layer stack (e.g., a substrate, a hard mask layer, an oxide layer (to form the mandrel), a COR mask layer and a mandrel mask layer) (500). The mandrel mask layer is patterned photo-lithographically, and employed as a mask to etch the COR mask layer and the oxide layer to form a mandrel with vertical walls (502). Then, the mandrel mask layer is removed. A chemical oxide removal (COR) process is used to undercut (i.e., etch back) the oxide layer (i.e., the mandrel shape) between the COR mask layer and the hard mask layer (504). The difference in location before and after etch-back determines image size and tolerance. Following the COR process, spacer material (e.g., a conformal nitride layer) is deposited (506) and etched (e.g., by directional etch 508) such that nitride spacer material remains below the COR mask layer around the vertical walls of the oxide mandrel. Subtractive SIT processing allows the space between a pair of SIT images formed on opposing walls of a mandrel to be less than the width of the original mandrel. The COR mask layer and oxide mandrel layer are then removed leaving a nitride loop (510) on the hard mask layer. The image of the nitride loop is transferred into the hard mask layer and the nitride loop is stripped (512, see FIG. 2). A trim mask is deposited and patterned to expose portion(s) (e.g., end portions) of the hard mask loop and the exposed portions are trimmed to form a hard mask pattern with distinct segment(s) 403 prior to etching the substrate (514-516, see FIG. 3). Lastly, the pattern is transferred into the substrate to form the discrete component(s) (518).

However, in both additive and subtractive SIT techniques, alignment of the trim mask to the SIT-defined hard mask loop pattern is difficult because the SIT-defined loop has a fixed width, which can be considerably less than typical lithographic dimensions. Additionally, the hard mask pattern is usually formed in only a thin film layer of hard-mask material. This combination of thin film and very narrow image makes "visibility" in lithographic tools difficult. Additionally, when mandrel-mask images are formed on minimum pitch, sidewall image formation can shrink the space between pairs of SIT so much that the use of the SIT pairs becomes impractical. Also, when using subtractive SIT techniques, for sufficiently wide undercuts on sufficiently narrow mandrels, it can become impossible (e.g., due to overlay and image size control limitations) to print trim shapes that reliably expose line segments to be trimmed without danger of also exposing adjacent desired "permanent" fin shapes you need to protect. Thus, there is a need for a sidewall image transfer process (e.g., either an additive or subtractive SIT process) that can effectively and efficiently be used to achieve improved tolerances for ultra thin fin features and/or to form patterns with pitch, as well as width, below that achievable using photo-lithography alone.

Therefore, disclosed herein are embodiments of patterning methods that may be used to pattern one or more discrete component shapes (e.g., fins, gate electrodes, etc.) into a substrate. In each embodiment alignment is eased because a trim mask is employed when images are much larger and/or are printed in much thicker and more visible films. For example, in an improved additive SIT processing method, a hard mask is trimmed prior to printing the mandrel mask. Similarly, in an improved subtractive SIT processing method, an oxide layer and memory layer that are used to form a mandrel are trimmed and the ends are protected prior to undercutting the mandrel sidewalls and forming the spacers. Additionally, since the trim step is conducted prior to image space manipulation (e.g., due to spacer formation of additive SIT or mandrel undercut of subtractive SIT), a size of the space between components is approximately equal to or greater than lithographic-minimum image sizes (rather than sub-lithographic sizes) so that trim mask alignment requirements can be eased.

Figure 6:
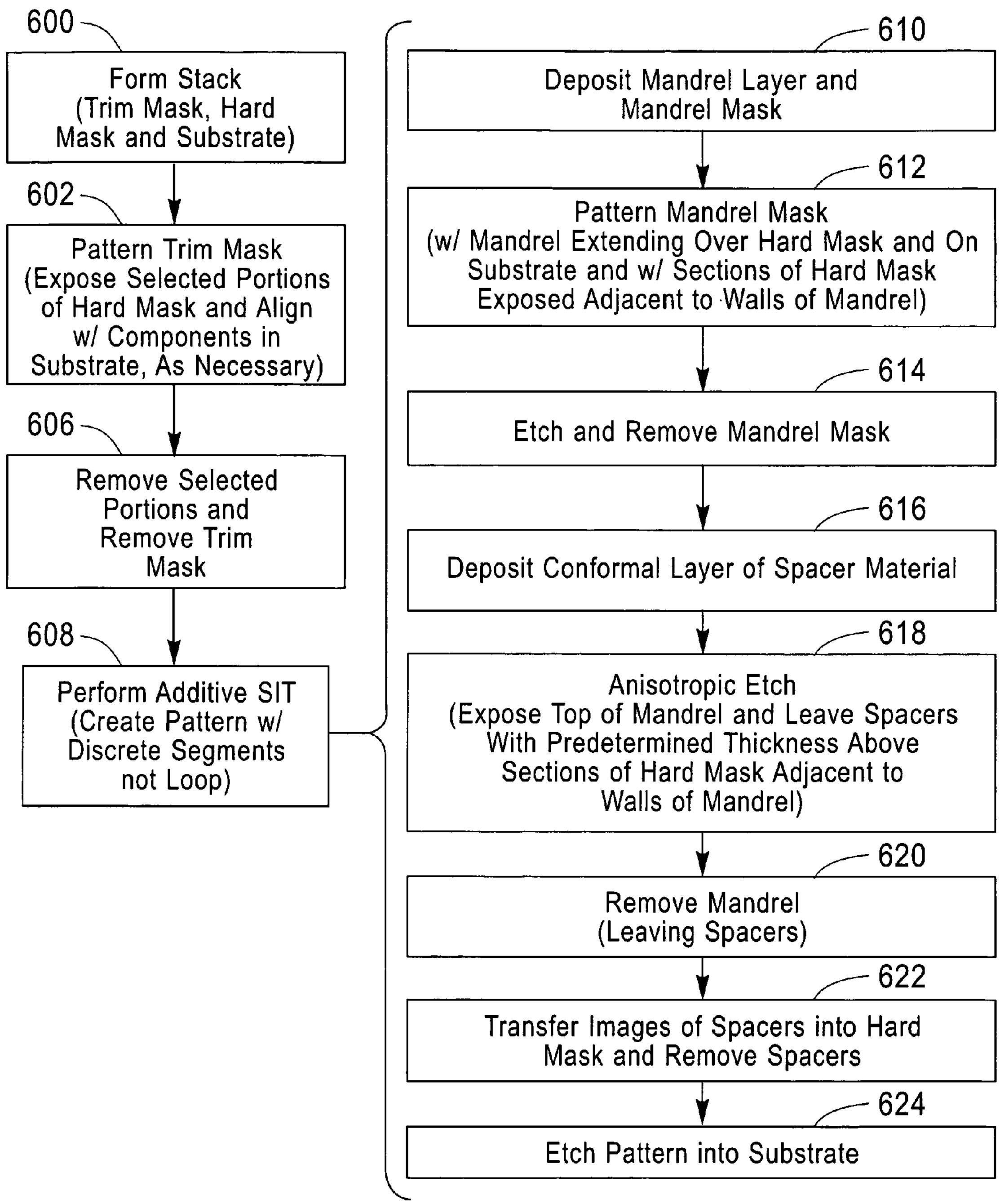
FIG. 6 is a schematic flow diagram illustrating an embodiment of the method of the invention incorporating an additive sidewall image transfer technique to form device components.
Figure 13:
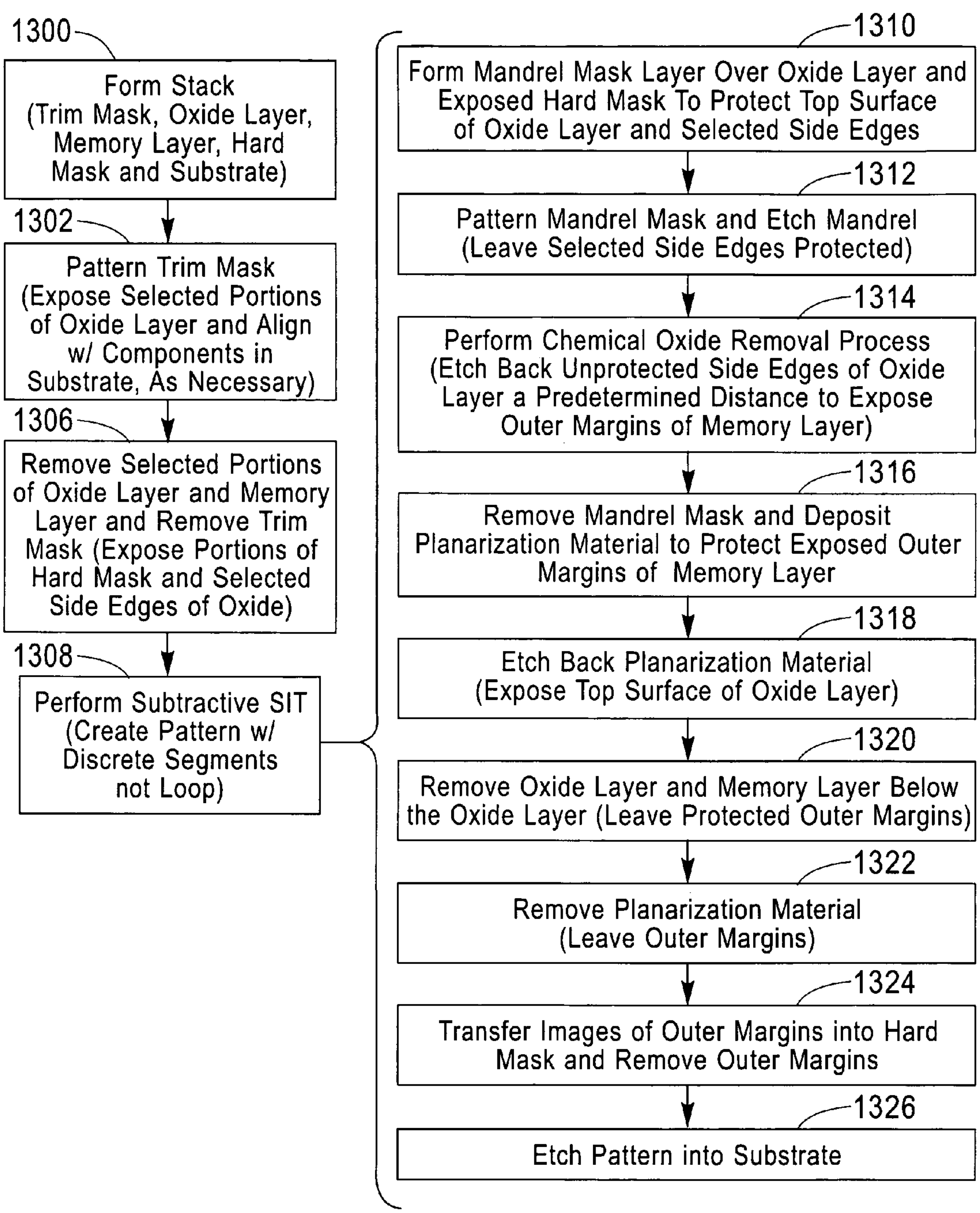
FIG. 13 is a schematic flow diagram illustrating an embodiment of the method of the invention incorporating a subtractive sidewall image transfer technique to form device components; and, FIGS. 14-22 are schematic diagrams illustrating partially completed devices formed according to the method illustrated in FIG. 13.

More particularly, in view of the foregoing, disclosed herein are embodiments of a patterning method for forming one or more discrete components (e.g., silicon fins, gate electrodes, etc) in a substrate (see the flow diagrams of FIGS. 6 and 13). Each embodiment of the method incorporates the use of a sidewall image transfer (SIT) technique, either an additive (see process 608 of FIG. 6) or a subtractive (see process 1308 of FIG. 13) SIT technique, to create a pattern in a mask (e.g., a hard mask). The patterned mask is then used to transfer the image into a substrate (e.g., by using a directional etching process) to form one or more discrete components. However, by conducting a trim step prior to performing either the additive or subtractive SIT process, the method of the invention avoids the formation of a loop pattern in the hard mask and, thus, avoids a post-SIT process trim step requiring trim mask alignment to sub-lithographic features. Specifically, such a pre-SIT process trim step avoids having to align a trim mask to features having less than current state of the art minimum lithographic dimensions in order to remove portions (e.g., end portions) of a loop pattern and, thereby, to form a pattern with one or more discrete segments.

Each of the exemplary embodiments of the method described below can be used to form a variety of different components, e.g., silicon fins for fin-type field effect transistors (finFETs), conductors (e.g., gate electrodes) to contact a dielectric layer (e.g., a gate dielectric layer) above active silicon regions in an underlying substrate layer, etc. However, for illustration purposes, the embodiment of FIG. 6 and the corresponding schematic drawings of FIGS. 7-12 illustrate the formation of a silicon fin for a finFET. Similarly, for illustration purposes, the embodiment of FIG. 13 and the corresponding schematic drawings of FIGS. 13-22 illustrate the formation of a gate electrode to contact a gate dielectric layer adjacent to an active silicon region. As mentioned above, each of the embodiments of the method may be also used to form a pattern with one or more discrete segments rather than a continuous loop. However, for illustration purposes, the exemplary embodiments described below illustrate the formation of a pattern with two discrete segments. Additionally, multiple discrete segments may be formed such that they are oriented at different angles with respect to each other (e.g., parallel, angled, perpendicular, etc.). However, for illustration purposes, the exemplary embodiments described below illustrate the formation of a pattern with discrete parallel segments.

Figure 7:
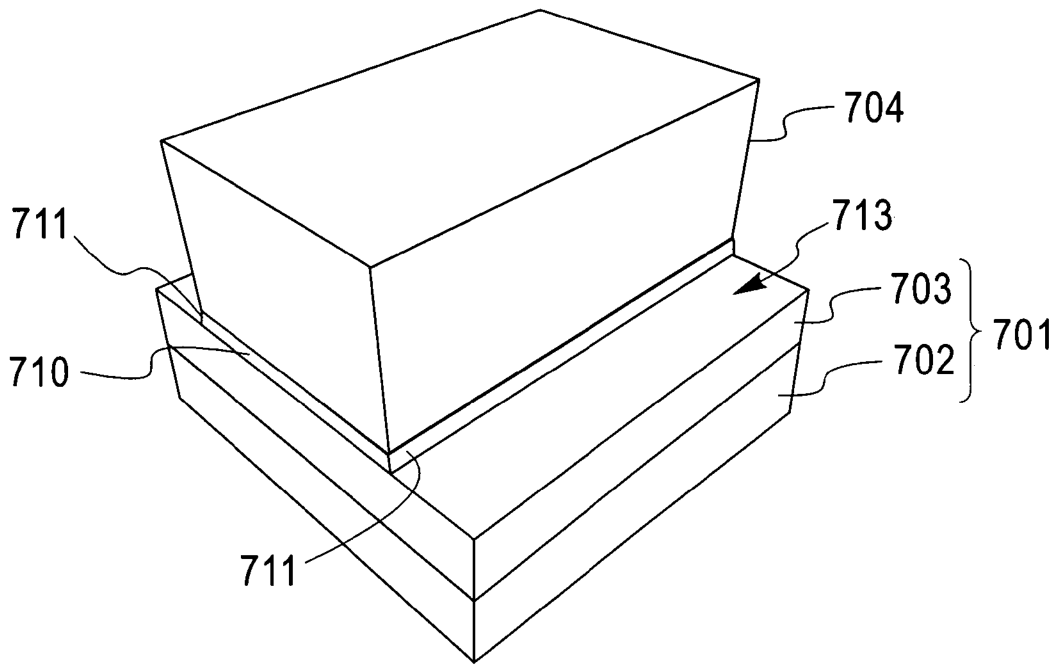
FIGS. 7-12 are schematic diagrams illustrating partially completed devices formed according to the method illustrated in FIG. 6.
Figure 14:
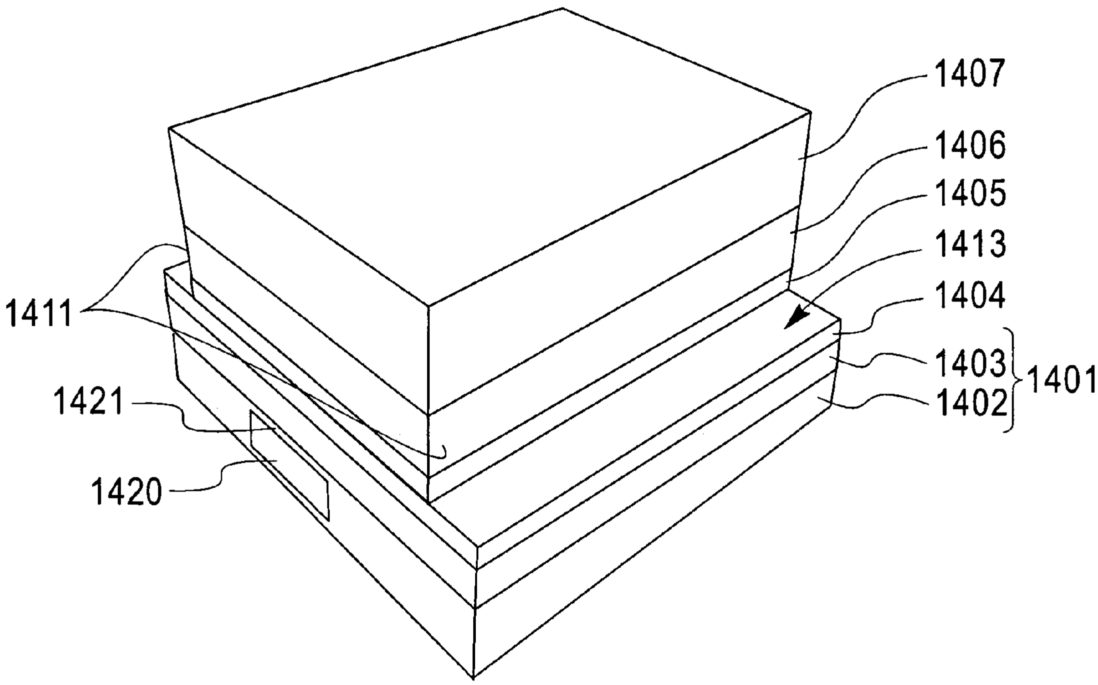
Figure 15:
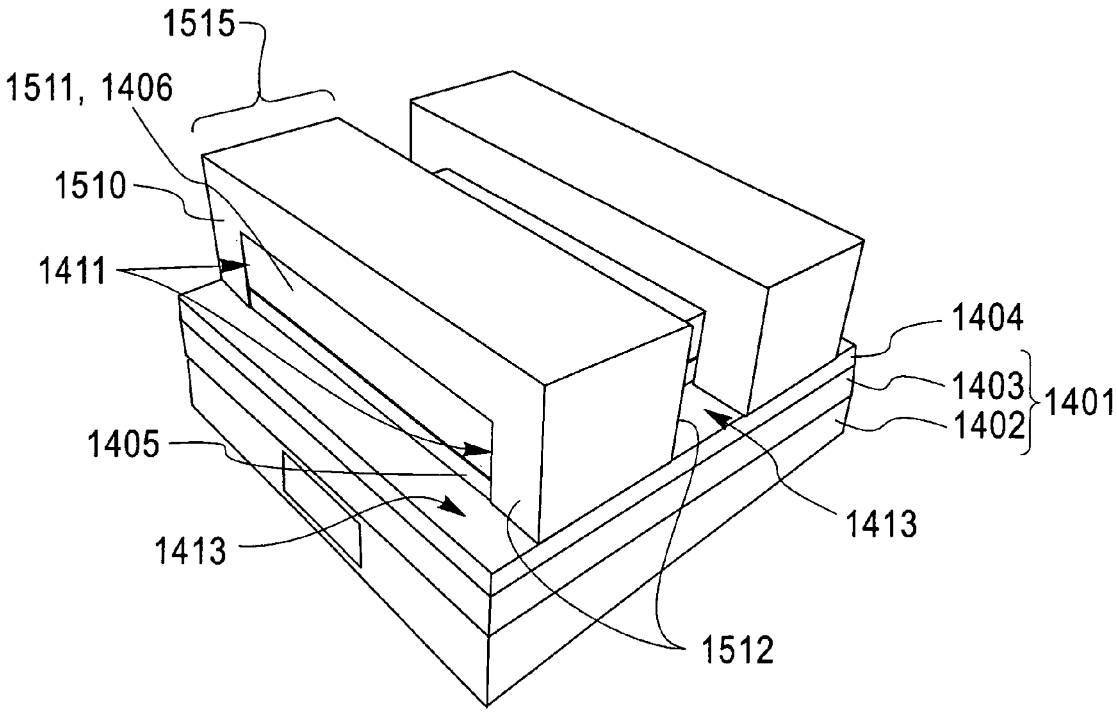
Figure 16:
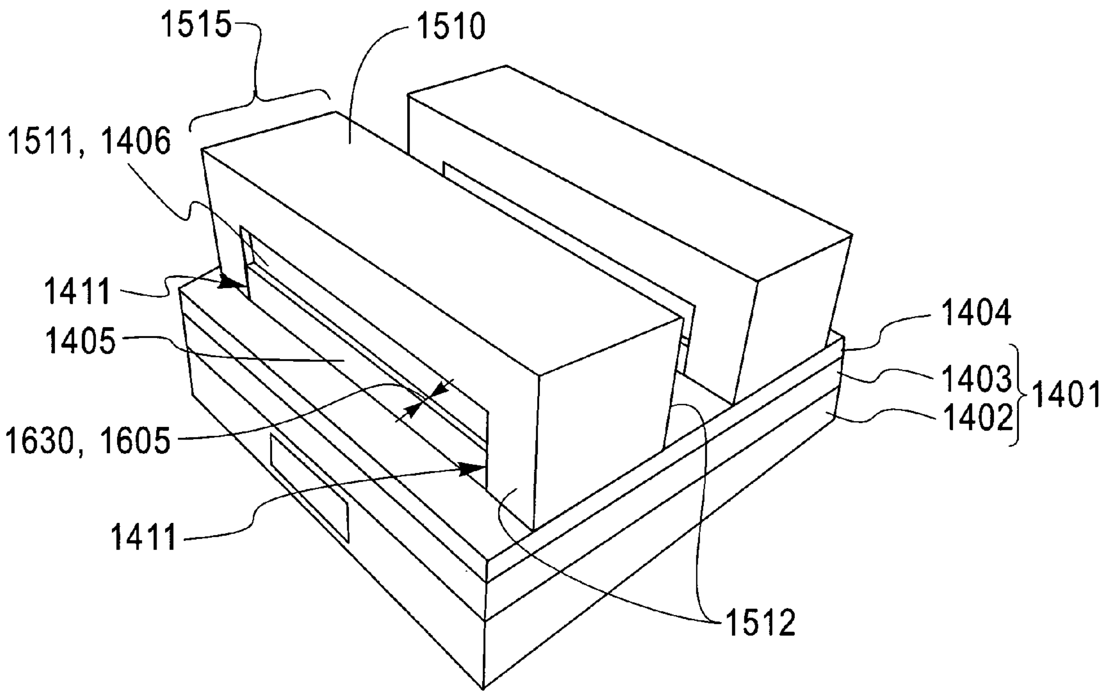
Figure 17:
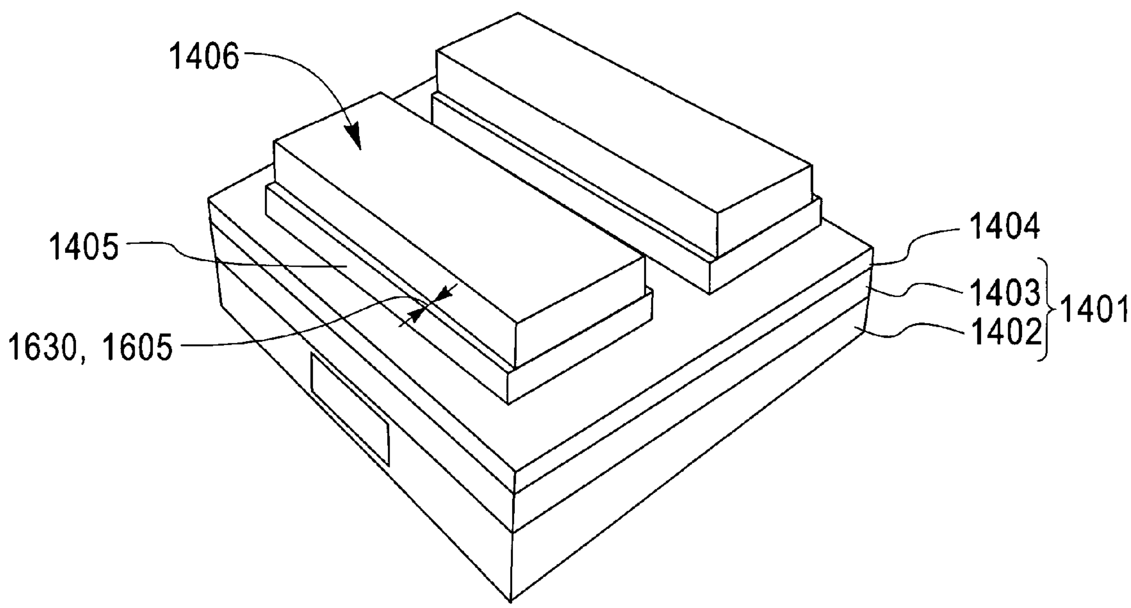

In one embodiment of the invention a patterning method is disclosed that incorporates an additive SIT technique similar to that described above. However, in this embodiment excess hard mask film is removed from undesired areas before depositing and defining the mandrels so that large patterns can be used for alignment. Thus, the thickness of alignment targets remains small, but alignment images can be of conventional size and shape. Specifically, referring to FIG. 6, in this embodiment a multi-layer stack is formed on a substrate 701 (600, see FIG. 7). For example, a hard mask layer 710 (i.e., a first mask layer such as a blanket oxide hard mask) can be formed on a substrate 701 and a trim mask layer 704 (i.e., a second mask layer such as a blanket photo-resist layer or another hard mask layer) can be formed on the hard mask layer 710. The composition of the substrate 701 can vary depending upon the type of component being formed. For example, if the SIT process of the method is being used to form a silicon fin for a finFET, then the substrate 701 may be formed with a silicon layer 703 above several other layers including a silicon dioxide layer 702, as illustrated in FIG. 7. Alternatively, if the SIT process is being used to form a conductor (e.g., a gate electrode) to contact a dielectric layer (e.g., a gate dielectric layer) on an active silicon region in the substrate, then a multi-layer substrate 1401, as illustrated in FIG. 14, can be formed with a conductor layer 1403, a dielectric layer 1421 below the conductor layer 1403, and active silicon regions 1420 below the dielectric layer 1421 (e.g., either active silicon regions within a buried oxide layer 1402 below the dielectric layer or active silicon regions separated by shallow trench isolation structures below the dielectric layer).

The trim mask layer 704 is patterned lithographically (i.e., printed) (602) to expose one or more selected portions (e.g., the end portions) of the hard mask layer 710. Patterning the trim mask layer 704 may include aligning the pattern with features in the substrate. For example, if gate electrodes are the components being formed, the trim mask pattern may be aligned with active silicon regions within the substrate so that the gate electrodes are ultimately aligned with the active silicon regions (see discussion below regarding alignment of trim mask to active silicon features as illustrated in FIG. 14). Then, the hard mask layer 701 is trimmed (e.g., etched) to remove the exposed selected portion or portions (606). This trimming process reduces the size of the hard mask layer (e.g., the length of the hard mask layer) and exposes portion(s) 713 of the substrate where the selected portion(s) of hard mask were removed (e.g., at both ends 711 of the hard mask layer 710) (see FIG. 7). More importantly, removing the selected portion(s) of the hard mask layer 710 prior to performing the additive SIT process, prevents a complete loop pattern from being formed in the hard mask layer 710 as a result of the subsequent additive SIT process and, specifically, ensures that a pattern with one or more discrete segments is created. For example, if two end portions of the hard mask are removed, then a pattern with two discrete components will be formed vice a continuous loop. Once the selected portion(s) of the hard mask layer 710 are removed, the trim mask layer 704 is removed.

Figure 8:
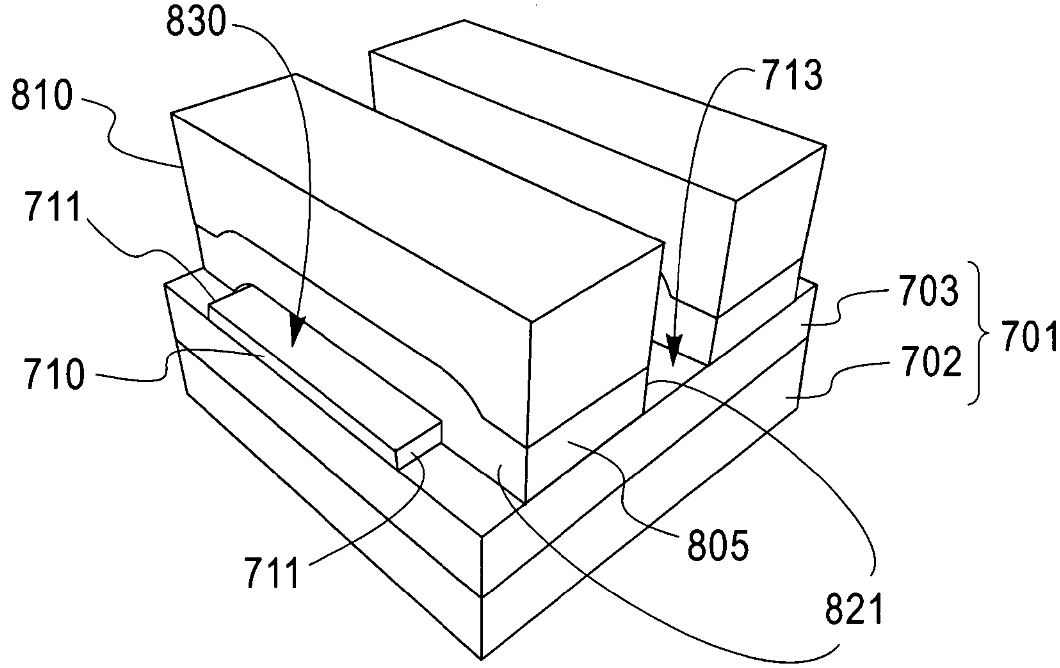

After the trim mask layer 704 is removed (606), a SIT process, such as an additive SIT process, (608) is performed. The SIT process (608) comprises forming a structure 805 with vertical walls 821, such as a mandrel, that extends over the remaining hard mask layer 710 (see FIG. 8) and onto the exposed portions 713 of the substrate 703. Specifically, the mandrel 805 is formed by forming a blanket mandrel layer over the hard mask layer 710 and over the exposed portions of the substrate 701. The blanket mandrel layer should comprise a material that can be selectively removed from the hard mask layer 710 and the substrate 701. For example, the mandrel 805 can be formed using a blanket germanium layer because germanium can be selectively removed from either an oxide hard mask layer or a silicon or oxide substrate without causing damage (at process 620, discussed below). A mandrel mask layer 810 (i.e., a third mask layer) is deposited over the mandrel layer (610). The mandrel mask 810 is patterned (i.e., printed) with the shape of the structure 805, e.g., with a narrow rectangular, trapezoidal or other-shaped band or mandrel, that is aligned with and extends across the hard mask layer 710 and over the exposed portions 713 of the substrate (612). Additionally, the mandrel mask 810 is patterned so that after the mandrel 805 is etched (at process 614) one or more exposed sections 830 of the hard mask layer 710 will be adjacent to one or more of the vertical walls of the mandrel 821 of the mandrel 805 (612). An etch process is then performed to form the mandrel 805, as patterned. For example, a rectangular mandrel can be etched such that the exposed sections of the hard mask layer are adjacent opposing parallel walls of the mandrel, as illustrated in FIG. 8. The etch needs sufficient overetch to clear any mandrel material 805 along the edges 711 of hard mask layer 710. Then, the mandrel mask 810 is removed (614).

Figure 9:
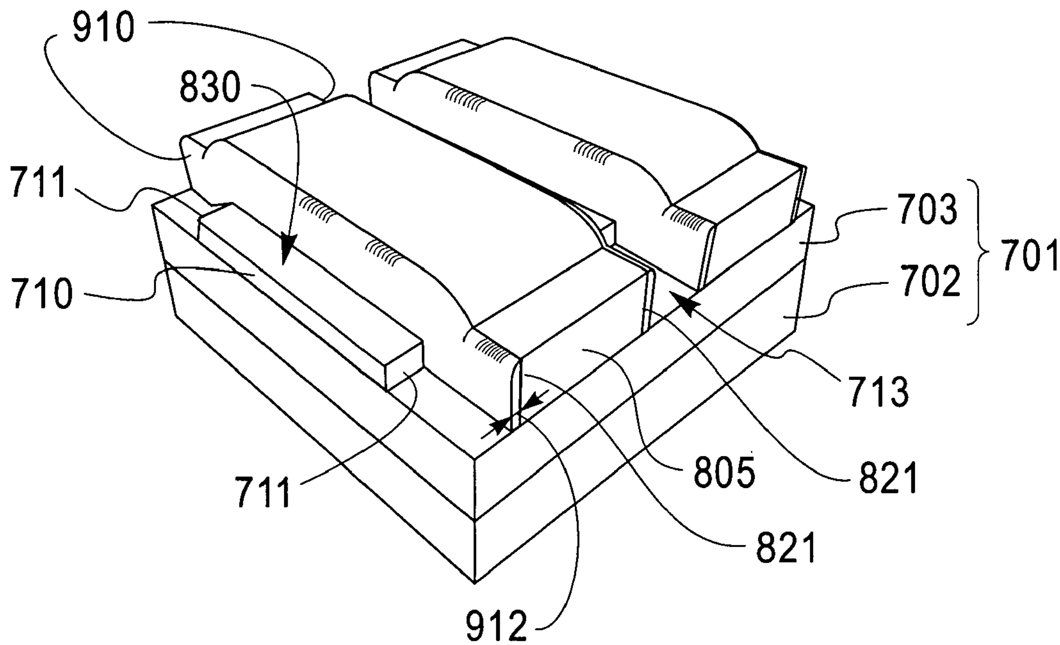
Figure 10:
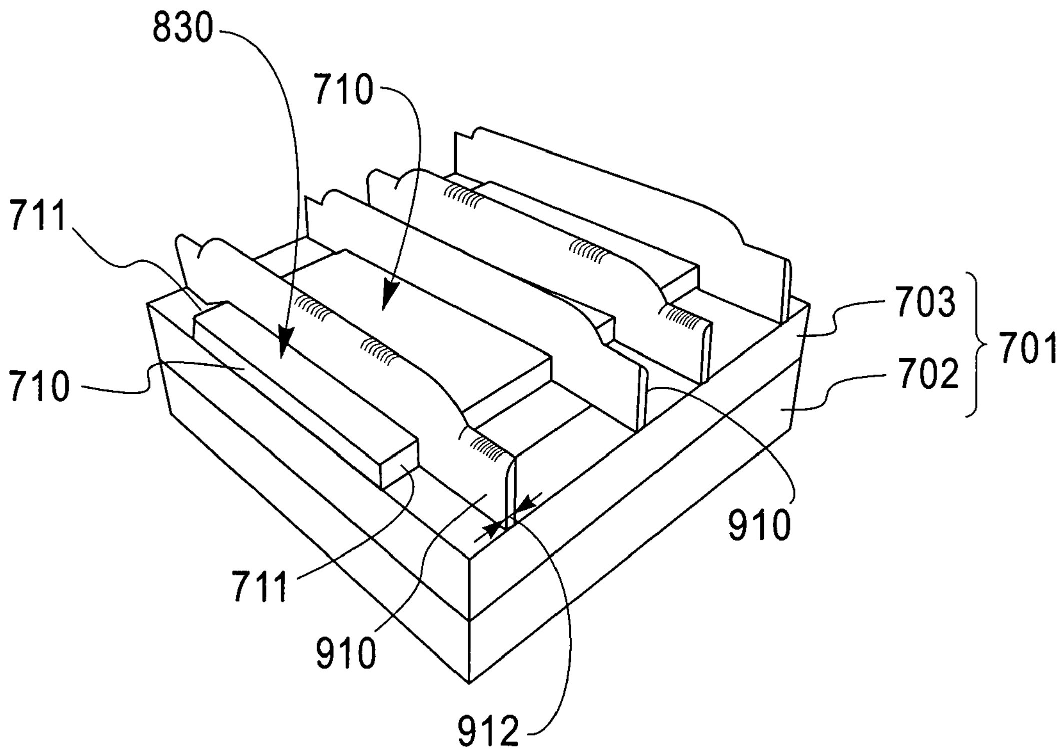

Once the mandrel 805 is formed, the next step in the SIT process (608), is to form spacer(s) 910 above the exposed section(s) 830 of the hard mask layer 710 and above the exposed section(s) of substrate 713 that are adjacent to the vertical walls 821 of the mandrel 805 (see FIG. 9). For example, if a rectangular mandrel is formed with parallel sections of the hard mask layer exposed adjacent opposing walls of the mandrel, then two parallel spacers can be formed above the parallel sections of hard mask on the opposing walls, as illustrated in FIG. 9. The spacer(s) 910 can be formed by depositing a conformal spacer material layer (e.g., a conformal nitride layer) over the mandrel 805 and exposed section(s) 830 of the hard mask layer 710 and the exposed substrate 713 (616). An anisotropic etch process, in which etch rate in the direction normal to the surface is much higher than in the direction parallel to the surface, is performed so that spacer(s) 910 remain only above section(s) of the hard mask layer 710 and above section(s) of substrate 713 adjacent to the vertical walls 821 of the mandrel (618). The etch needs sufficient overetch to clear any spacer material 910 along the edges 711 of hard mask layer 710. Considering both the thickness of the deposited conformal layer and the etch rate in the direction parallel to the surface, the spacer(s) 910 can be formed with a predetermined thickness 912 that is equal to a desired width of the component(s) being formed (e.g., a desired width of a fin or a desired width of a conductor). After the spacer(s) 910 are formed, the mandrel 805 is selectively removed off of the hard mask layer 710 and the substrate 701 (e.g., by selectively etching a germanium mandrel using a hydrogen peroxide cleaning solution) such that discrete spacer(s) 910 having a predetermined thickness 912 are left extending across the hard mask layer 710 and on the substrate 701 in those areas where selected portions of the hard mask layer were previously trimmed (at process 606) (620, see FIG. 10).

Figure 11:
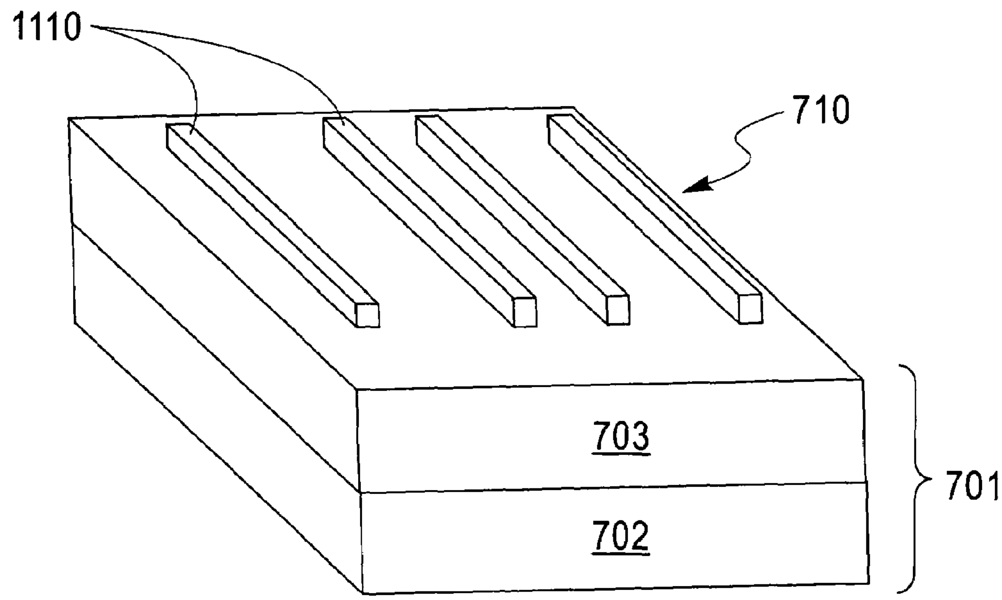

Once the mandrel 805 is removed (at process 620), the hard mask layer 710 is etched (e.g., by an anisotropic and selective etching process such as a reactive ion etch (RIE) process) to transfer the pattern of the spacer(s) 910 into the hard mask layer 710 (622, see FIG. 11). For example, as illustrated in FIG. 11, if two parallel spacers are formed (at processes 616-618), then the image of the two parallel spacers is transferred into the hard mask. Specifically, during the etching process, section(s) of the hard mask layer 710 are masked (i.e., protected) by the spacer(s) 910 so that a pattern with one or more discrete segments 1110 is created from the hard mask layer 710.

Figure 12:
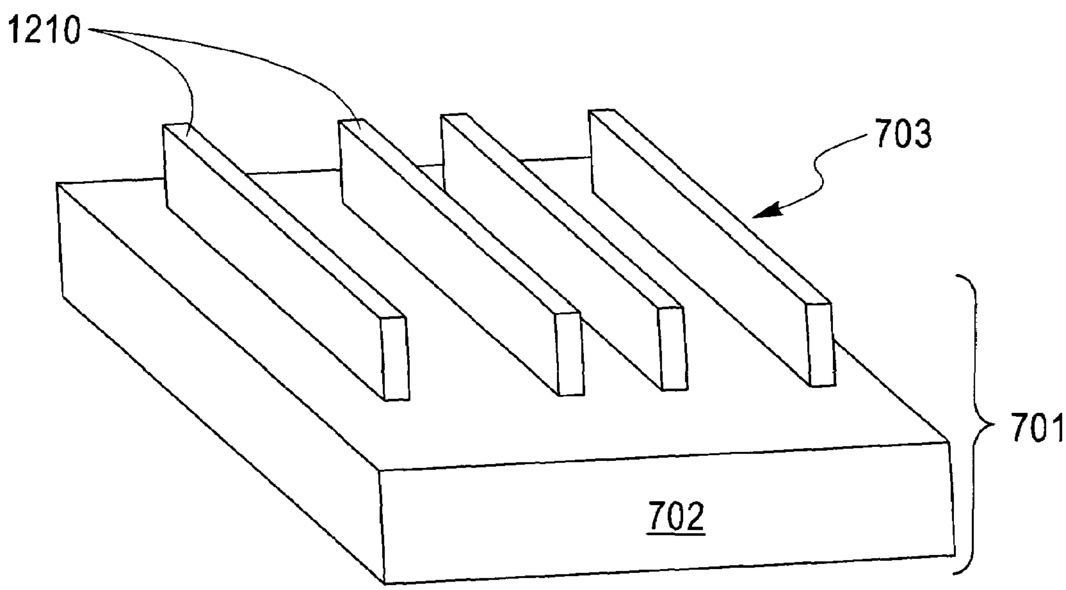

Once the pattern is formed in the hard mask layer 710, another etching process (e.g., another anisotropic and selective etching process) is performed to transfer the pattern of the hard mask layer 710 into the substrate to create the one or more discrete components 1210 (624, see FIG. 12). Specifically, during the etching process, section(s) of the substrate are masked (i.e., protected) by the remaining discrete segment(s) 1110 of the hard mask layer 710 so that discrete component(s) 1210 are created from the substrate 701. For example, a pattern that is formed in the hard mask layer 710 can protect portions of a silicon substrate 701 during the etching process such that discrete silicon fins 1210 are formed for a fin-type field effect transistor. Alternatively, a pattern that is formed in the hard mask layer and previously aligned by the second mask layer over an active silicon region of the substrate (see FIG. 22) can protect portions of a conductor layer of the substrate during the etching process such that discrete gate electrodes are formed in the substrate and extend to a gate dielectric layer over the active silicon region.

In another embodiment of the invention, a method is disclosed that incorporates the use of a subtractive SIT technique similar to that described above. However, in this embodiment the selected walls of the mandrel are masked to prevent etch-back of the oxide layer at the masked walls so that the final line width in those areas will be zero (i.e., no lines will form). As with the previously described embodiment, the thickness of alignment targets thus remains small, but alignment images can be of conventional size and shape. Specifically, referring to FIG. 13, the method comprises forming a multi-layer stack on a substrate 1401 (1300, see FIG. 14). For example, a hard mask layer 1404 (i.e., a first mask layer) is formed on a substrate 1401, a memory layer 1405 is formed on the hard mask layer 1404, an oxide layer 1406 is formed on the memory layer 1405 and a trim mask layer 1407 (i.e., a second mask layer) is formed on the oxide layer 1406. As with the previously described embodiment, the composition of the substrate 1401 can vary depending upon the type of component being formed. For example, if the SIT process is being used to form a silicon fin for a finFET, then the substrate may be formed with a silicon layer above several other layers including a silicon dioxide layer (as illustrated in FIG. 7). Alternatively, if the SIT process is being used to form a conductor (e.g., a gate electrode) to contact a dielectric layer (e.g., a gate dielectric layer) on an active silicon region in the substrate, then a multi-layer substrate 1401 can be formed with a conductor layer 1403, a dielectric layer 1421 below the conductor layer 1403, and active silicon regions 1420 below the dielectric layer 1421 (e.g., either active silicon regions within a buried oxide layer 1402 below the dielectric layer or active silicon regions separated by shallow trench isolation regions below the dielectric layer). The hard mask layer 1404 should be formed of a material that is capable of withstanding a subsequent chemical oxide removal (COR) process (see discussion of process 1314 below) without damage. For example, the hard mask layer 1404 can comprise a nitride layer. The memory layer 1405 should also be formed of a material that is capable of withstanding the COR process and also capable of being etched selectively over the hard mask layer 1404. For example, the memory layer 1405 can be formed of a blanket polysilicon film layer. The oxide layer 1406 is used to form the mandrel and can comprise a blanket layer of any silicon dioxide ($SiO_2$)-based material. Lastly, the trim mask layer 1407 can comprise a photo-resist layer, another hard mask layer, or any other suitable material for forming a trim mask.

The trim mask layer 1407 is patterned (1302) (i.e., printed) to expose a selected portion or portions (e.g., end portions) of the oxide layer 1406 above the memory layer 1405. Patterning the trim mask layer 1407 may also include aligning the pattern of the trim mask with features of the substrate. For example, if gate electrodes are being formed, the trim mask pattern may be aligned with the active silicon regions 1420 within the substrate so that the gate electrodes when formed are ultimately aligned with the active silicon regions 1420. Then, the selected portion(s) of the oxide layer 1406 and the memory layer 1405 below are removed (i.e., trimmed by using, e.g., an etching process) (1306). This trimming process (1306) reduces the size of the oxide 1406 and memory 1405 layers (e.g., the length of the layers). Additionally, this trimming process (1306) exposes both portions 1413 of the hard mask 1404 and selected side edges 1411 of the oxide 1406 and memory 1405 layers adjacent to the exposed portions 1413 of the hard mask layer. The trim mask layer 1407 is then removed (1306).

After the trim mask layer 1407 is removed (at process 1306), a SIT process, such as a subtractive SIT process, is performed (1308). Specifically, a mandrel mask layer 1510 (i.e., a third mask layer) is formed (e.g., deposited) over the oxide layer 1406 and onto the exposed portions 1413 of the hard mask 1404 such that the selected side edges 1411 of the oxide layer 1406 and memory layer 1405 are covered (1310). For example, if at process 1306 end portions of the oxide and memory layers are exposed and removed, the mandrel mask layer 1510 is deposited over the oxide layer 1406 and onto the exposed end portions 1413 of the hard mask layer such that selected edges 1411 of the oxide 1406 and memory 1405 layers are covered and protected (1310, see FIG. 15). The mandrel mask layer 1510 is patterned (i.e., printed) in order to form a structure 1515 having vertical walls 1512 (e.g., a narrow rectangular, trapezoidal or other-shaped band or mandrel). The mandrel 1515 is selectively etched to the hard mask layer 1404 such that the selected side edges 1411 of the memory layer and oxide layer remain covered by the mandrel mask, such that additional portions 1413 of the hard mask layer 1404 are exposed, and such that unprotected side edges 1511 of the memory layer 1405 and oxide layer 1406 are exposed at one or more of the vertical walls 1512 (1312). The mandrel mask 1510 functions as a diffusion-block or chemical-block during subsequent processing steps and, specifically, should be formed of a material that has a predetermined thickness and is capable of withstanding a subsequent COR process (e.g., a 200-400 nm photoresist material). Specifically, the mandrel mask 1510 protects the selected edges 1411 of the oxide layer 1406 from etch back during the subsequent subtractive sidewall image process so that a pattern can be created with discrete segments in the hard mask layer 1404.

Once the mandrel 1515 is formed, a COR process, e.g., as illustrated in U.S. patent application Ser. No. 10/711,458, is performed to etch back the unprotected side edges 1511 of the oxide layer 1406 at the vertical wall(s) 1512 beneath the mandrel mask layer 1510 and to thereby expose one or more outer margins 1605 of the memory layer 1405 (1314, see FIG. 16). The COR process (1314) is a plasma-free/damage-free chemical etch which can be used to etch $SiO_2$-based materials without damaging other material such as a nitride hard mask layer or a photoresist third mask layer. During the COR process, the top surface and selected side edges 1411 of the oxide layer 1406 are protected by the mandrel mask layer 1510, thereby, preventing exposure of a complete loop pattern of the outer margins of the memory layer 1405 as the oxide layer 1406 is etched back. The unprotected side edges 1511 are etched back a predetermined distance 1630 (equal to a desired width of the components being formed) in order to expose only the outer margin(s) 1605 of the memory layer 1405 below the unprotected edges 1511 of the oxide layer.

For example, end portions of the oxide layer and memory layer can be removed at process 1306 and a rectangular mandrel can be formed across the oxide layer such that selected side edges at the opposing ends of the rectangular mandrel are protected by the mandrel mask at process 1310. At process 1314 unprotected side edges of the oxide layer would be etched back at opposing sidewalls of the mandrel, leaving parallel outer margins of the memory layer exposed. However, the memory layer at the protected ends would remain covered by the oxide layer. Thus, subsequent processing will result in a pattern with discrete parallel segments (as opposed to a loop), each having a width equal to the desired width of the component.

Figure 18:
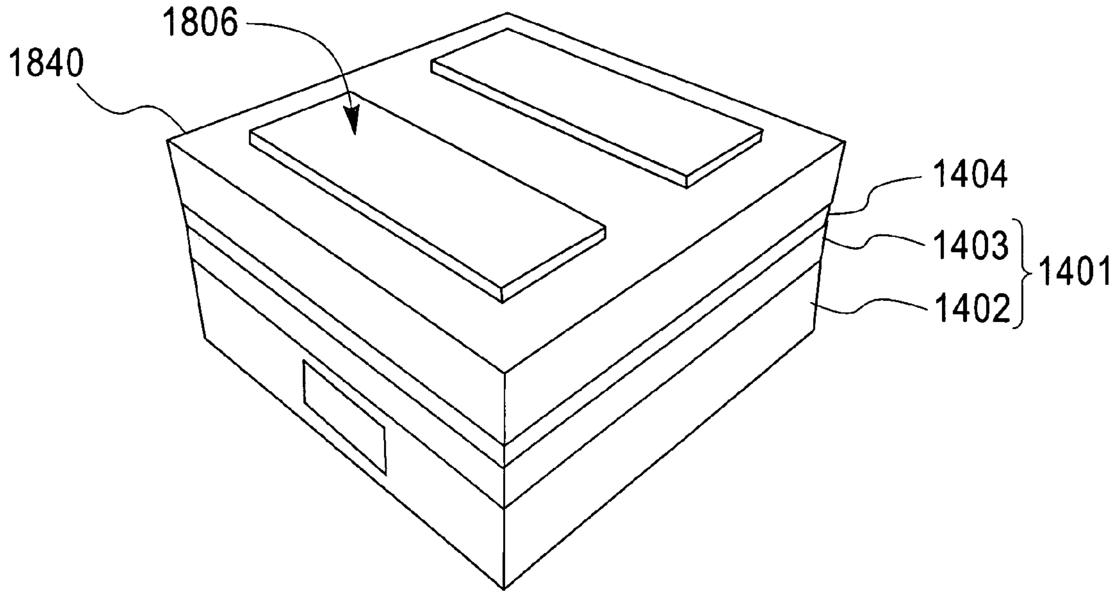

After the (COR) process (1314), the mandrel mask layer is removed (see FIG. 17) and the exposed outer margin(s) 1605 of the memory layer 1405 are protected (1316, see FIG. 18). Specifically, to protect the exposed outer margin(s) 1605 of the memory layer 1405, a blanket planarization material 1840 (e.g., a polymer) is deposited over the exposed portions 1413 of the hard mask layer 1404, over the exposed outer margin(s) 1605 of the memory layer and over the oxide layer 1406. The planarization material 1840 is then etched or developed back to expose a top surface 1806 of the oxide layer (1318).

Figure 19:
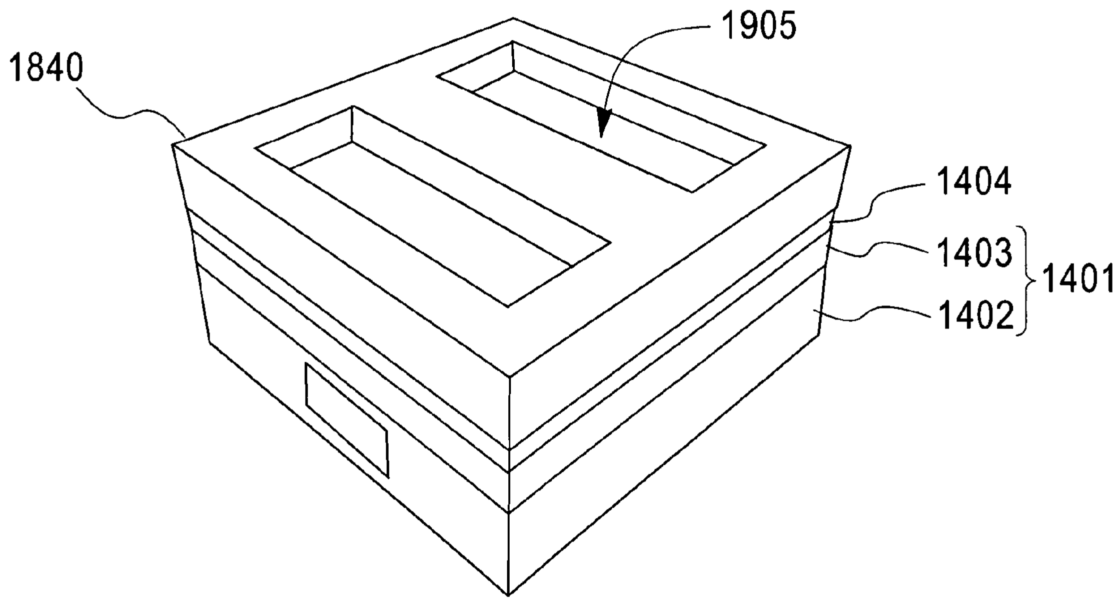
Figure 20:
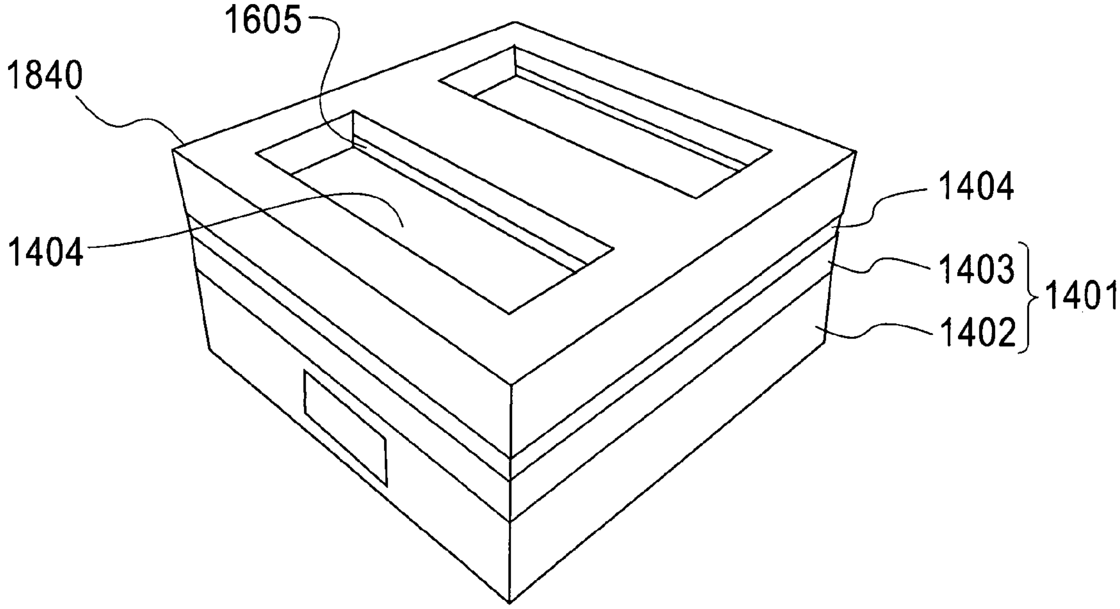
Figure 21:
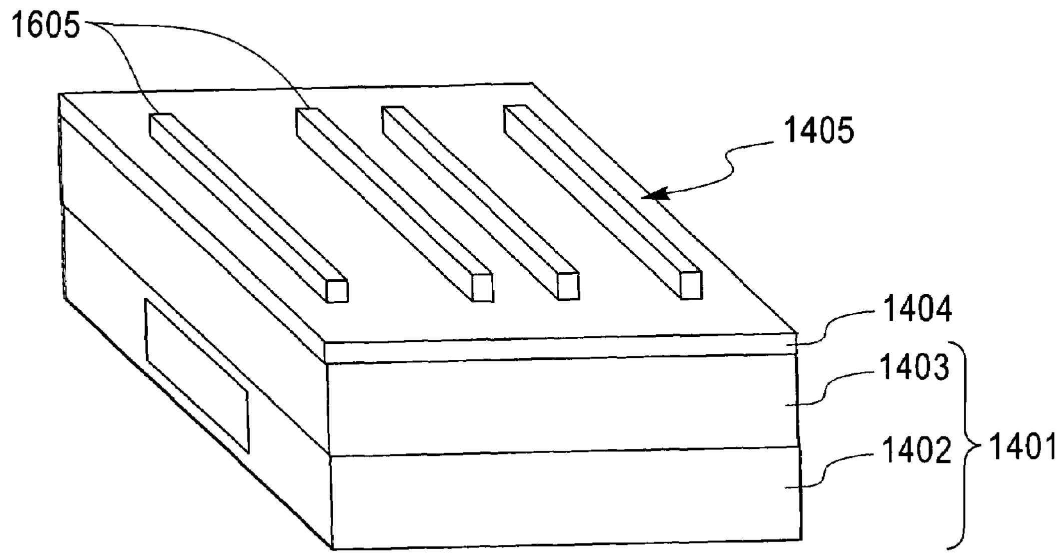

Once the outer margin(s) 1605 of the memory layer 1405 are protected and the top surface of the oxide layer 1406 is exposed (see processes 1316-1318), the oxide layer 1406 is removed (e.g., by a wet etch employing buffered hydrofluoric acid (HF)) (1320, see FIG. 19). Removing the oxide layer 1406 exposes a remaining portion 1905 (e.g., a center portion) of the memory layer, while leaving the outer margin(s) 1605 protected. This remaining portion 1905 of the memory layer is then selectively removed (e.g., by RIE) (1322, see FIG. 20). The planarization material 1840 is then removed (at process 1322) (i.e., stripped) revealing only discrete segment(s) of the memory layer 1405 corresponding to the outer margin(s) 1605 (see FIG. 21).

Once the planarization material is removed, the hard mask layer 1404 is etched (e.g., by an anisotropic and selective etching process such as a reactive ion etch (RIE) process) to transfer the pattern of the outer margin(s) 1605 of the memory layer into the hard mask layer 1404 (1324). Specifically, during the etching (at process 1324), section(s) of the hard mask layer 1404 are masked (i.e., protected) by the discrete segment(s) of the memory layer 1405 corresponding to the outer margin(s) 1605 so that a pattern with discrete segment(s) 2004 is created in the hard mask layer 1404.

Figure 22:
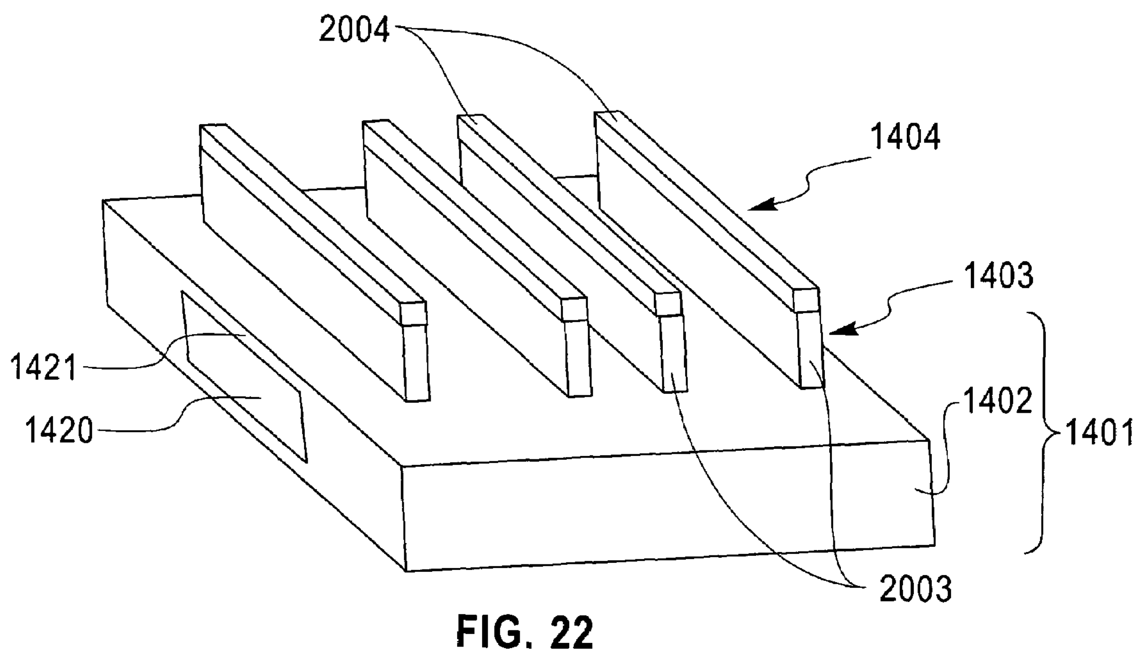

As with the previously described embodiment, once the pattern is formed in the hard mask layer 1404 an etching process (e.g., an anisotropic and selective etching process) is performed to transfer the pattern of the hard mask layer 1404 into the substrate 1401 to create discrete components 2003 (1326, see FIG. 22). Specifically, during the etching (at process 1326), sections of the substrate 1401 are masked (i.e., protected) by the remaining discrete segments 2004 of the hard mask layer 1404 so that the discrete components 2003 are created in the substrate 1401. For example, a pattern that is formed in the hard mask layer can protect portions of a silicon substrate during the etching process such that discrete silicon fins are formed for a fin-type field effect transistor (see FIG. 12). Alternatively, as illustrated in FIG. 22, a pattern that is formed in the hard mask layer 1404 and previously aligned by the second mask layer over an active silicon region 1420 of the substrate can protect portions of a conductor layer of the substrate during the etching process such that discrete gate electrodes 2003 are formed and extend to a gate dielectric layer 1421 above the active silicon region 1420.

Therefore, disclosed herein are embodiments of patterning method that may be used to pattern one or more discrete component shapes (e.g., fins, gate electrodes, etc.) into a substrate. In each embodiment alignment requirements are eased because a trim mask is employed when images are much larger and/or are printed in much thicker and more visible films. By conducting a trim step prior to performing either the additive or subtractive SIT process, the method of the invention avoids the formation of a loop pattern in the hard mask and, thus, avoids a post-SIT process trim step requiring alignment of a trim mask to sub-lithographic features to form a hard mask pattern with the discrete segments. In one embodiment a hard mask is trimmed prior to conducting an additive SIT process so that a loop pattern is not formed. In another embodiment an oxide layer and memory layer that are used to form a mandrel are trimmed prior to the conducting a subtractive SIT process. A mask is then used to protect the portions of the mandrel during etch back of the oxide layer so that a loop pattern is not formed.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the invention can be practiced with modification within the spirit and scope of the appended claims.

What is claimed is:

1. An imaging method for forming at least one device component in a substrate, said method comprising:

forming a first mask layer on said substrate, a memory layer on said first mask layer, an oxide layer on said memory layer; and a trim mask layer on said oxide layer;

using said trim mask layer to remove at least one selected portion of said oxide layer and said memory layer to expose a portion of said first mask layer and at least one selected side edge of said oxide layer; and after removing said at least one selected portion of said oxide layer and said memory layer, patterning said first mask layer with at least one discrete segment using a sidewall image transfer process, wherein said sidewall image transfer process comprises:

depositing a third mask layer on said oxide layer and said first mask layer;

patterning said third mask layer to form a structure having vertical walls, wherein said third mask layer covers a top surface of said oxide layer and said at least one selected side edge and wherein at least one of said vertical walls exposes at least one unprotected side edge of said oxide layer;

performing a chemical oxide removal process to etch back said at least one unprotected side edge to expose at least one outer margin of said memory layer; and removing said third mask layer.

2. The method of claim 1, wherein by patterning said first mask layer, after removing said at least one selected portion, said method avoids a subsequent trim process that requires alignment to a feature in said first mask layer that has less than current state of the art minimum lithographic dimensions.

3. The method of claim 1, wherein said sidewall image transfer process further comprises:

protecting said at least one outer margin;

removing said oxide layer from said memory layer;

removing a remaining portion of said memory layer from said first mask layer without removing said at least one outer margin thereby forming at least one discrete segment; and transferring an image of said at least one discrete segment into said first mask layer to create said at least one discrete segment.

4. The method of claim 1, wherein said oxide layer is etched back an amount equal to a desired width of said at least one component.

5. The method of claim 1, further comprising forming said substrate with a silicon layer and etching said pattern into said substrate to form at least one silicon fin for a fin-type field effect transistor.

6. The method of claim 1, further comprising:

forming said substrate to have an active silicon region, a dielectric layer above said active silicon region and a conductor layer above said dielectric layer;

during said patterning of said second mask layer, aligning said second mask layer with said active silicon region; and etching said pattern into said conductor layer to form at least one gate electrode that extends to said dielectric layer and is aligned above said active silicon region.

* * * * *